(12) United States Patent
Yabuzaki et al.

(10) Patent No.: US 7,629,668 B2
(45) Date of Patent: Dec. 8, 2009

(54) COMPOSITE SEMICONDUCTOR DEVICE

(75) Inventors: Jun Yabuzaki, Matsumoto (JP); Takeshi Yokoyama, Matsumoto (JP); Tomonori Seki, Azumino (JP)

(73) Assignee: Fuji Electric Technology Co., Ltd., Tokyo (JP)

( * ) Notice: Subject to any disclaimer, the term of this patent is extended or adjusted under 35 U.S.C. 154(b) by 0 days.

(21) Appl. No.: 12/078,323

(22) Filed: Mar. 28, 2008

(65) Prior Publication Data
US 2008/0237790 A1    Oct. 2, 2008

(30) Foreign Application Priority Data
Mar. 30, 2007    (JP) .............. 2007-092310

(51) Int. Cl.
*H01L 29/00* (2006.01)

(52) U.S. Cl. .............. 257/531; 257/288; 257/350; 257/E21.364; 257/E21.421; 257/E21.411; 257/E21.499; 257/E21.511

(58) Field of Classification Search .............. 257/531, 257/249, 260, 265, 288, 350, 713, 737, 738, 257/742, 743, 762
See application file for complete search history.

(56) References Cited

U.S. PATENT DOCUMENTS

| 6,678,144 | B2 * | 1/2004 | Higashi et al. | ........... 361/306.3 |
| 6,855,573 | B2 * | 2/2005 | Li et al. | .............. 438/106 |
| 6,979,907 | B2 * | 12/2005 | Li et al. | .............. 257/783 |
| 7,005,747 | B2 * | 2/2006 | Koizumi | .............. 257/777 |
| 7,079,371 | B2 * | 7/2006 | Yamasaki | .............. 361/303 |
| 7,443,654 | B2 * | 10/2008 | Asami et al. | .............. 361/528 |

FOREIGN PATENT DOCUMENTS

| JP | 2002-057037 | 2/2002 |
| JP | 2004-072815 | 3/2004 |

* cited by examiner

*Primary Examiner*—David Nhu
(74) *Attorney, Agent, or Firm*—Rabin & Berdo, PC (57) ABSTRACT

The electrode of a thin-type capacitor is connected to the rear surface of a p-type semiconductor substrate which is brought to a ground potential, by a conductive DAF (Die Attach Film) or by a conductive adhesive, and the electrodes of the front surface of the p-type semiconductor substrate are respectively connected with and stacked on the terminals of a thin-type inductor by bumps, whereby manufacturing costs can be reduced while the occurrence of noise can be suppressed and packaging area can be made small.

15 Claims, 6 Drawing Sheets

Fig. 11  Priort Art

Fig. 12  Priort Art

Fig. 13 Prior Art

COMPOSITE SEMICONDUCTOR DEVICE

BACKGROUND OF THE INVENTION

1. Field of the Invention

This invention relates to a composite semiconductor device which constitutes a DC-DC converter or the like that is installed in portable electrical equipment or the like. More particularly, this invention relates to a composite semiconductor device of a small-sized-type and a thin-type, in which a thin-type capacitor or the like is stacked on a semiconductor substrate (semiconductor chip) formed with an integrated circuit (IC).

2. Background of the Related Art

A DC-DC converter which is used in portable electronic equipment exemplified by a portable telephone, a digital camera or a digital video camera, is so configured that an inductor, a capacitor, etc. are externally mounted separately from a power source IC. For the purpose of coping with the requirements of such portable electronic equipment, whose size has been reduced year by year, a PCB (Printed Circuit Board) on which the DC-DC converter is packaged also needs to be made smaller in area.

A power source IC having multiple channels, in which control circuits for driving a large number of DC-DC converters, respectively, are integrated, has been employed often in recent years. Since, however, inductors and capacitors are externally mounted, reduction in the size of the multi-channel power source IC has been limited.

Figure 9:
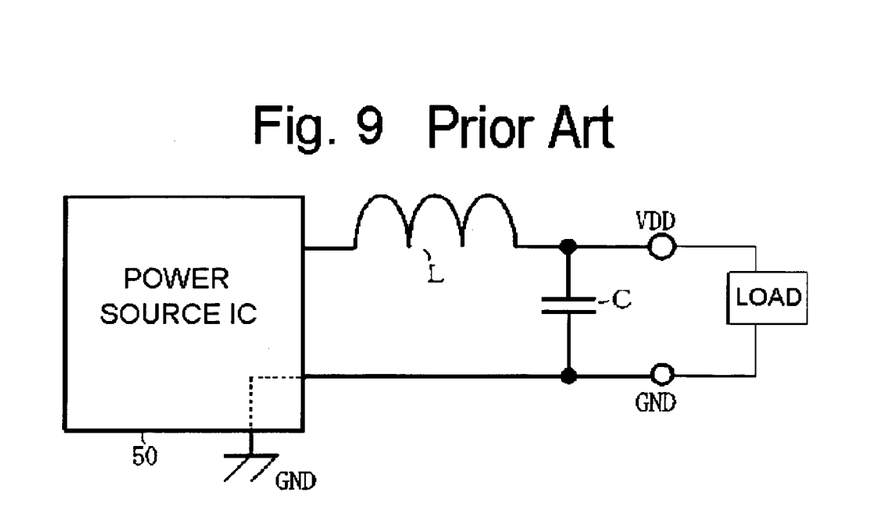
FIG. 9 is an arrangement diagram of the essential circuit of a conventional DC-DC converter.

FIG. 9 is a diagram showing the arrangement of an essential circuit of a DC-DC converter. An inductor L is connected to a power source IC 50, while one electrode of a capacitor C is connected to the inductor L, and the resulting connection point is connected with a VDD terminal which is the main DC terminal of the DC-DC converter. Additionally, ground (GND) of the power source IC 50 and another electrode of the capacitor C are connected, and the resulting connection point is connected with a GND terminal of the DC-DC converter. The VDD terminal and the GND terminal are connected with a load. The power source IC 50 has multiple channels and has control circuits which are respectively connected to a plurality of inductors L and are integrated.

Figure 10:
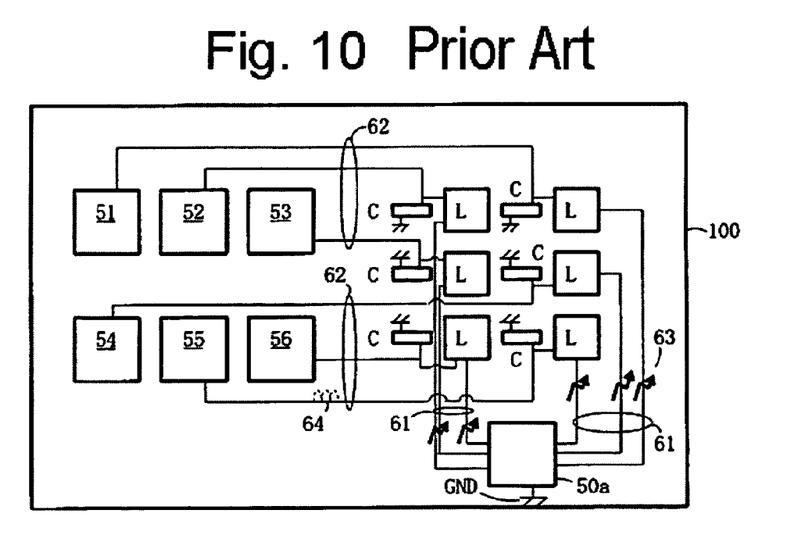
FIG. 10 is a plan view of a PCB on which a power source IC with six channels integrated, six inductors, six capacitors, and six loads being ICs are conventionally packaged.

FIG. 10 is a view showing a PCB on which are packaged a power source IC with six channels integrated, six inductors, six capacitors, and ICs as six loads.

The power source IC 50a is formed with six channels, the respective channels are connected with the six inductors L by wiring lines 61, these inductors L and the six capacitors C are respectively connected, and the individual loads 51-56 are connected to the respective connection points between the inductors L and the capacitors C. The power source IC 50a, the inductors L, the capacitors C, and the ICs as loads 51-56 are secured on PCB 100.

When the power source IC 50a in which the multiple channels are integrated is employed as shown in FIG. 10, it becomes difficult to arrange the inductors L and the capacitors C near the power source IC 50a. Besides, distances to the loads 51-56 (devices such as ICs), which are power feed destinations, become long. For this reason, wiring lines 61 which connect the power source IC 50a with the inductors L and the capacitors C become long, and noise 63 arises from the wiring lines 61. In addition, as wiring lines 62 to the loads 51-56 become long, problems occur, such as unstable operation of the power source IC 50a on account of a voltage oscillation ascribable to a wiring line inductance 64, and the ICs as loads 51-56 cannot demonstrate original performances due to voltage drops ascribable to currents which are fed to the loads 51-56, for example, when currents to be consumed in these loads 51-56 have changed abruptly.

Figure 11:
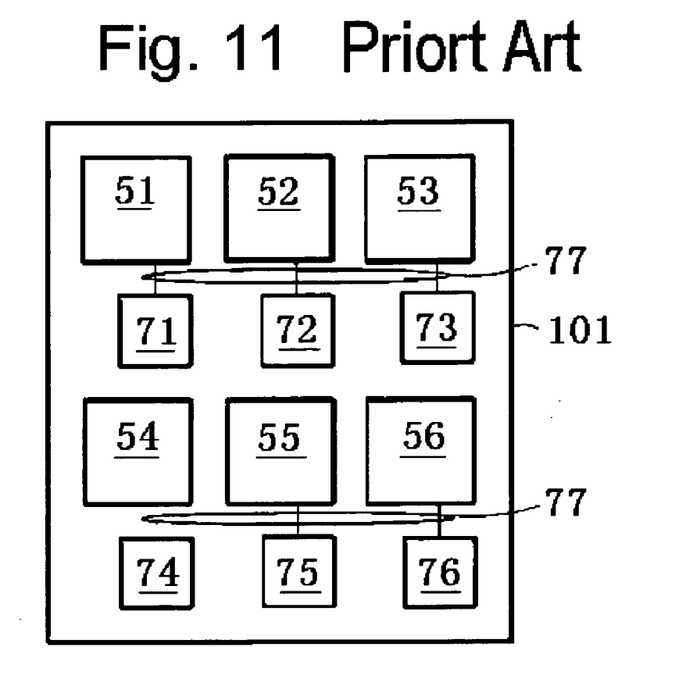
FIG. 11 is a plan view of a PCB on which composite semiconductor devices and loads are conventionally packaged.

In order to solve the problems, there has been practiced a technique wherein, as shown in FIG. 11, composite semiconductor devices 71-76, in each of which are formed a power source IC of single channel, are made unitary with an inductor and a capacitor, and the unitary composite semiconductor devices 71-76 are arranged in the vicinities of loads 51-56, thereby shortening wiring lines 77 to the loads 51-56. Additionally for this solution, the area of a PCB 101 can also be made small.

Figure 12:
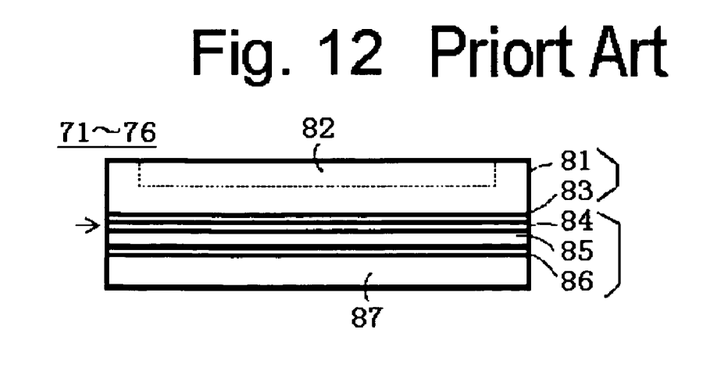
FIG. 12 is a sectional view of the essential portions of a composite semiconductor device in the related art.

Patent Document JP-A-2002-57037 discloses a technique wherein, as shown in FIG. 12, a buffer layer 83 is formed on the rear surface of a semiconductor substrate 81 formed with an integrated circuit, a thin-type capacitor is formed by epitaxially growing a dielectric layer 85 on the buffer layer 83, and a thin-type inductor 87 is formed in the thin-type capacitor. Numeral 82 in the figure designates in phantom an element formation region in which elements constituting the integrated circuit are formed, and numerals 84 and 86 designate the electrodes of the thin-type capacitor, respectively.

Figure 13:
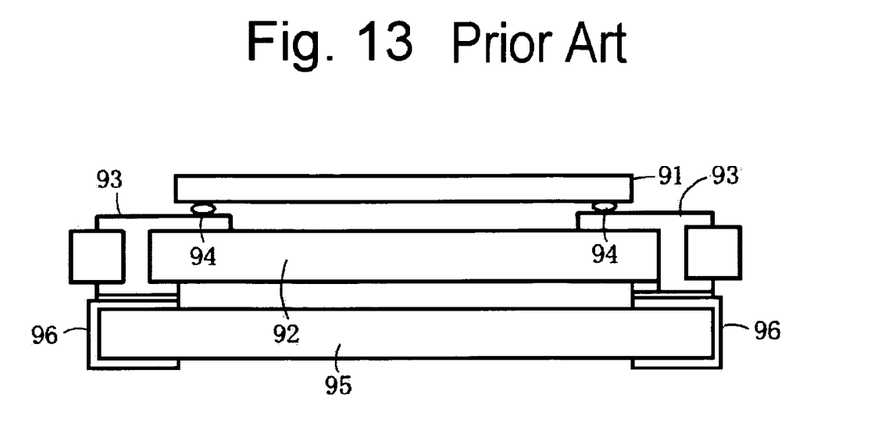
FIG. 13 is a sectional view of the essential portions of another composite semiconductor device in the related art.

Patent Document JP-A-2004-72815 discloses a technique wherein, as shown in FIG. 13, a surface on the front side of a semiconductor substrate 91 formed with a power source IC and the front surfaces of the terminals 93 of a thin-type inductor 92 are connected by bumps 94, and the rear surfaces of the terminals 93 of the thin-type inductor 92 and the electrodes 96 of a thin-type capacitor 95 are secured by a conductive adhesive (not shown).

With the technique of Patent Document JP-A-2002-57037, however, the thin-type capacitor is formed on the rear surface of the semiconductor substrate 81 by epitaxial growth, so that the manufacturing method is complicated and the cost becomes high. Moreover, the dispersion of capacitor characteristics tends to enlarge on account of the complexity of the manufacturing processes.

Besides, with the technique of Patent Document JP-A-2004-72815, the semiconductor substrate 91 and the surfaces of the terminals 93 of the thin-type inductor 92 are connected by bumps 94, and the electrodes 96 of the thin-type capacitor 95 are connected onto the rear surfaces of the terminals 93 of the thin-type inductor 92 by conductive adhesive. Therefore, the electrical connections between the semiconductor substrate 91 and the thin-type capacitor 95 are made through the bumps 94, the terminals 93 penetrating through the thin-type inductor 92, and the electrodes 96 of the thin-type capacitor 95. One of the paths of the connections is also used for grounding one electrode of the thin-type capacitor 95, but the connections need to be established more directly for the purpose of enhancing characteristics influenced by cost and noise.

Objects of this invention include solving the above problems and providing a composite semiconductor device, in which a capacitor is connected to the rear surface of a semiconductor substrate to be brought to a GND potential, at a low cost.

SUMMARY OF THE INVENTION

These and other objects are accomplished by providing a composite semiconductor device configured to include a thin-type capacitor and a semiconductor substrate whose rear surface to be brought to a GND (ground) potential is secured to one electrode of the thin-type capacitor through a conductive DAF (Die-Attach Film).

Additionally, the composite semiconductor device is configured to include a thin-type inductor having one terminal secured by a bump to an electrode formed on a surface of a front side of the semiconductor substrate which is formed with elements. The other terminal of the thin-type inductor is connected to the other electrode of the thin-type capacitor by wire bonding.

Further, the composite semiconductor device is configured by including a thin-type inductor having one terminal secured by a bump to an electrode formed on a surface of the front side of the semiconductor substrate which is formed with elements. A metal film is formed on the rear surface of the semiconductor substrate and is connected by wire bonding to a GND terminal formed in the inductor.

Still further, the composite semiconductor device of the invention is configured to include a thin-type inductor which has one terminal secured by a bump to an electrode formed on a surface of the front side of the semiconductor substrate which is formed with elements, and a metal film which is formed on the rear surface of the semiconductor substrate and which is connected to the electrode by a connection conductor that penetrates through the semiconductor substrate.

In addition, the conductivity type of the semiconductor substrate is made to be p-type, whereby the rear surface of the semiconductor substrate can be brought to the GND potential.

Further, a conductive adhesive be employed instead of the conductive DAF (Die-Attach Film).

Still further, the conductive adhesive may be a silver paste or a solder.

Additionally, a metal film may be formed on the rear surface of the semiconductor substrate, and one electrode of the thin-type capacitor and the rear surface of the semiconductor substrate may be secured through the metal film.

According to this invention, the electrode of the thin-type capacitor is connected to the rear surface of the p-type semiconductor substrate to be brought to the GND potential, by the conductive DAF (Die-Attach Film) or the conductive adhesive, and the electrode on the front surface of the p-type semiconductor substrate and the terminal of the thin-type inductor are connected and stacked by the bump, whereby manufacturing cost can be reduced and packaging area can be made small.

Additionally, the thin-type capacitor may be adhered and secured to the rear surface of the p-type semiconductor substrate by the conductive DAF, whereby the GND potential need not be established by wire bonding, and the electrode structure of the thin-type capacitor can be simplified to reduce the manufacturing cost.

The GND potential of the rear surface of the p-type semiconductor substrate is stabilized by forming the conductive film on the rear surface of the p-type semiconductor substrate, and connecting the conductive film and the GND terminal with wire bonding, or by connecting the conductive film and the electrode formed on the surface of the front side of the p-type semiconductor substrate with a connection conductor which penetrates through the p-type semiconductor substrate.

Further, by connecting the constituents of a DC-DC converter, including a power source IC (control circuit), a thin-type inductor and a thin-type capacitor, at the shortest distances, the occurrence of noise can be suppressed to demonstrate the original characteristics of the DC-DC converter.

DETAILED DESCRIPTION OF THE INVENTION

This invention will now be described in conjunction with embodiments by exemplifying a structure in which a semiconductor substrate, a thin-type capacitor and a thin-type inductor constituting a DC-DC converter are stacked.

Embodiment 1

Figure 1:
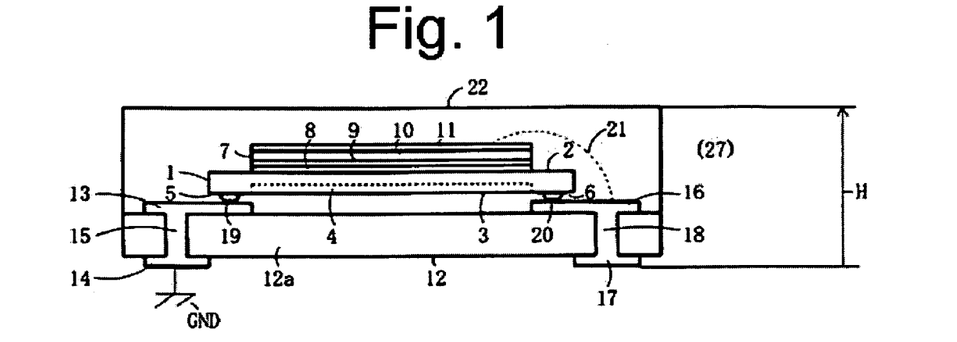
FIG. 1 is a sectional view of the essential portions of a composite semiconductor device according to a first embodiment of this invention.
Figure 5:
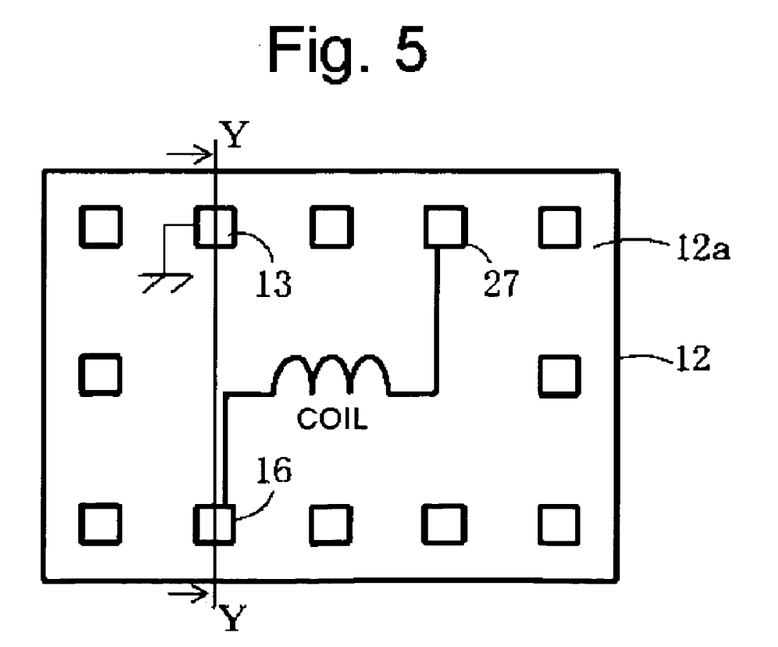
FIG. 5 is a plan view of the essential portions of a thin-type inductor.

FIG. 1 is a sectional view of the essential portions of a composite semiconductor device in the first embodiment of the invention. A GND terminal 13, which is disposed for a thin-type inductor 12 (shown in detail in FIG. 5 to be described later since the terminal 13 is not always connected with the inductor (coil) body), and an electrode 5, which is formed on surface 3 of the front side (the side on which an element formation region 4 for MOSFETs etc. constituting a power source IC is existent) of a p-type semiconductor substrate 1, which is the substrate of a semiconductor chip, are connected by a bump 19 (based on flip-chip bonding). Besides, the other terminal 16 of the thin-type inductor 12 (as shown in FIG. 5, the terminal 16 is connected to one terminal of the inductor (coil) body) and the other terminal 6 formed on the surface 3 of the front side of the p-type semiconductor substrate 1 are connected by a bump 20. The rear surface 2 (the side which becomes a GND potential) of the p-type semiconductor substrate 1 and the electrode 9 of a thin-type capacitors 7 are positioned and secured through a conductive DAF 8 (Die Attach Film), thereby to be connected. The electrode 11 of the thin-type capacitor 7 and the other terminal 27 (not shown in detail, see FIG. 5) of the thin-type inductor 12 are connected by wire bonding 21. Thereafter, the whole structure is encapsulated in a resin mold 22. The thin-type capacitor 7 mentioned above is a parallel plate type capacitor, and has a chip-shaped configuration in which a dielectric 10 is sandwiched in between the electrode 9 and the electrode 11 which are parallel plates.

Owing to the conductive DAF 8, the electrode 9 of the thin-type capacitor 7 electrically becomes equal in potential to the rear surface 2 of the p-type semiconductor substrate 1. The electrode 14 of the thin-type inductor 12 is connected with the GND of the composite semiconductor device, and this GND terminal 14 is connected with the GND terminal 13 through a connection conductor 15 which is formed in a penetrating hole provided in the ferrite 12a of the thin-type inductor 12. The electrode 5 which is formed on the front surface 3 of the semiconductor substrate 1 is brought to the GND potential through the bump 19 connected with the GND terminal 13. Since this electrode 5 is connected to the p-type semiconductor substrate 1 in a place outside the element formation region 4, the rear surface 2 of the p-type semiconductor substrate 1 is brought to the GND potential through the interior thereof.

Since the p-type semiconductor substrate 1 is at the GND potential, the electrode 9 of the thin-type capacitor 7 can be brought to the GND potential through the conductive DAF 8. Also, the other electrode 11 of the thin-type capacitor 7 is directly connected to the other terminal (27 in FIG. 5), not shown, of the thin-type inductor 12 by the wire bonding 21.

The thin-type capacitor 7 and the p-type semiconductor substrate 1 are positioned together and secured by the conductive DAF 8, thereby to be connected, so that manufacturing processes can be simplified and cost can be lowered more than in the case of Patent Document 1. Moreover, the thin-type capacitor 7 and the p-type semiconductor substrate 1 (power source IC) which are individually formed are stuck and connected to each other through the conductive DAF 8, so that the characteristic dispersions of the thin-type capacitor 7 and the power source IC can be made smaller than in the case of previously mentioned Patent Document JP-A-2002-57037 where the thin-type capacitor 7 and the power source IC are formed by semiconductor processes together.

Additionally, rear surface 2 of the p-type semiconductor substrate 1 which is at GND potential is connected with electrode 9 of the thin-type capacitor 7, whereby one electrode, electrode 9, of the thin-type capacitor 7 can be brought to the GND potential without being connected to the GND terminal 13 by wire bonding. Moreover, this dispenses with an electrode structure like the conventional electrodes 96 in FIG. 13, in relation to the thin-type capacitor.

In addition, a height H from the thin-type inductor 12 to the upper surface of the resin mold 22 can be made 1.2 mm or less in the case where the composite semiconductor device is installed in a portable telephone or the like.

Incidentally, numeral 17 in FIG. 1 designates the terminal of the thin-type inductor 12, and numeral 18 the connection conductor thereof.

Embodiment 2

Figure 2:
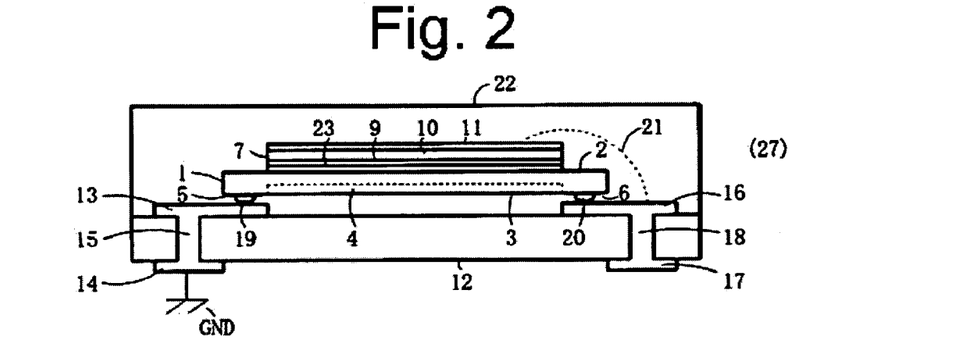
FIG. 2 is a sectional view of the essential portions of a composite semiconductor device according to a second embodiment of this invention.

FIG. 2 is a sectional view of the essential portions of a composite semiconductor device in the second embodiment of this invention. The difference of FIG. 2 from FIG. 1 is the point that the conductive DAF 8 is replaced with a conductive adhesive 23, such as a silver paste or solder. Also in this case, the same advantages as in FIG. 1 are obtained.

Figure 3:
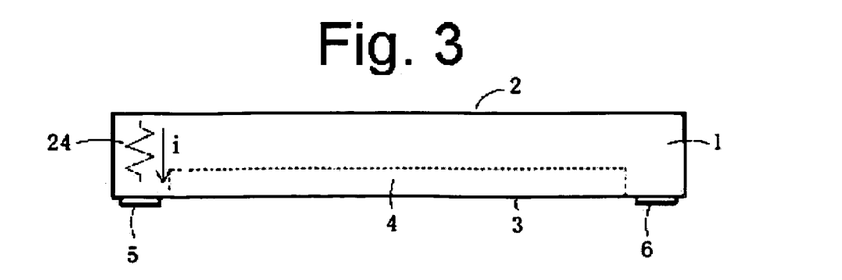
FIG. 3 is a view showing a situation where a current, i, flows toward ground (GND) within a semiconductor substrate.

In each of the cases of FIGS. 1 and 2, when a current, i, which flows from the thin-type capacitor 7 toward that electrode 5 on the front surface 3 which is connected with the GND terminal 13 (not shown in FIGS. 1 and 2, but shown in FIG. 3) is large, a voltage drop arises due to a resistance 24 in the vertical direction of the p-type semiconductor substrate 1, and the GND potential of the rear surface 2 becomes unstable. A method for preventing this drawback will be described in the next embodiment.

Embodiment 3

Figure 4:
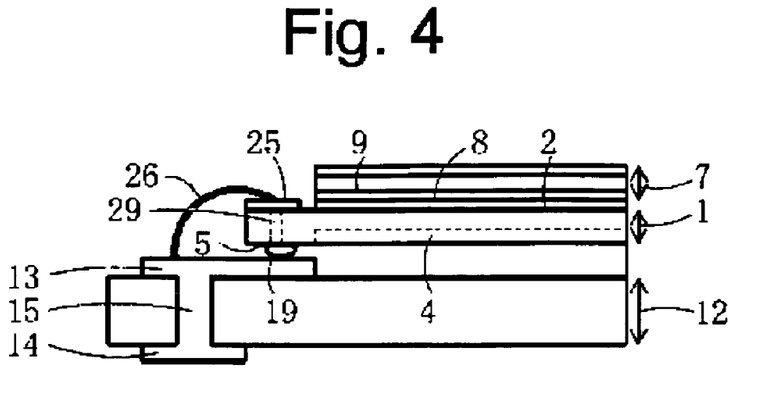
FIG. 4 is a sectional view of the essential portions of a composite semiconductor device according to a third embodiment of this invention.

FIG. 4 is a sectional view of the essential portions of a composite semiconductor device in the third embodiment of this invention. A metal film 25 is formed on the rear surface 2 of a p-type semiconductor substrate 1, and this metal film 25 and the GND terminal 13 of a thin-type inductor 12 are connected by wire bonding 26. Also, the connection between the electrode 9 of the thin-type capacitor 7 and the rear surface 2 of the p-type semiconductor substrate 1 is made by a conductive DAF 8. Thus, the same advantages as in FIG. 1 or FIG. 2 are obtained.

Additionally, although no illustration has been made, the wire bonding 26 may, of course, be omitted and a penetrating hole provided instead in the p-type semiconductor substrate 1, and then metal film 25 and electrode 5 are joined by a connection conductor 29 indicated in phantom in FIG. 4 by dashed lines.

Thus, the rear surface 2 of the p-type semiconductor substrate 1 is directly connected to the ground (GND) just as in FIG. 1 or FIG. 2, so that the influence of a voltage drop ascribable to a current, i, from the thin-type capacitor 7 is small enough to stabilize the GND potential of the rear surface 2 of the p-type semiconductor substrate 1.

More specifically, the embodiment in FIG. 1 is applicable to a case where the current, i, to flow through the thin-type capacitor 7 is comparatively small. When the current, i, becomes large, the voltage drop in the p-type semiconductor substrate 1 enlarges to fluctuate the GND potential of the rear surface 2 of the p-type semiconductor substrate 1, so that the embodiment in FIG. 1 is not applicable.

On the other hand, in the case of FIG. 4, a metal film 25 is formed on the rear surface 2 of the p-type semiconductor substrate 1, and this metal film 25 and the GND terminal 13 of the thin-type inductor 12 are connected by the wire bonding 26, whereby the current, i, of the thin-type capacitor 7 does not pass through the p-type semiconductor substrate 1 in the vertical direction thereof. Therefore, the voltage drop becomes small, and the GND potential of the rear surface 2 of the p-type semiconductor substrate 1 can be stabilized.

FIG. 5 is a plan view of the essential portions of the thin-type inductor 12. The thin-type inductor 12 is such that a ferrite 12a is formed with a coil, and that the terminals 16 and 27 of the coil are formed on the front surface of the ferrite 12a. Additionally, the ferrite 12a is formed with terminals which are connected with the GND terminal 13 and the other electrode of the p-type semiconductor substrate 1 by bumps, at the peripheral parts of the ferrite 12a and in a manner to penetrate through the ferrite 12a.

Incidentally, each of the first to third embodiments has been described as to the case where the thin-type capacitor 7 and the thin-type inductor 12 are stacked on the p-type semiconductor substrate 1, but it is also allowed to stack only the thin-type capacitor 7 on the p-type semiconductor substrate 1 and to externally mount an inductor individually.

Embodiment 4

Figure 6:
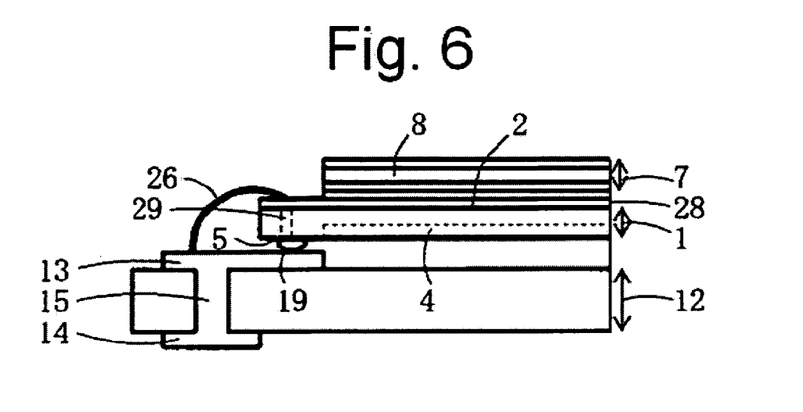
FIG. 6 is a sectional view of the essential portions of a composite semiconductor device according to a fourth embodiment of this invention.

FIG. 6 is a sectional view of the essential portions of a composite semiconductor device in the fourth embodiment of this invention. A metal film 28 is formed on the whole area of the rear surface 2 of a p-type semiconductor substrate 1, and this metal film 28 and the GND terminal 13 of a thin-type inductor 12 are connected by wire bonding 26. Also in this case, the rear-surface electrode 28 and an electrode 5 may well be joined by a connection conductor 29 indicated in phantom by dashed lines, instead of the wire bonding 26. When the metal film 28 is formed on the whole rear surface 2 in this manner, a natural oxidation film which appears on the rear surface 2 can be coped with. Simultaneously, a current, i, which flows through a thin-type capacitor 7 flows through the metal film 28 and does not flow into the p-type semiconductor substrate 1, so that the GND potential of the rear surface 2 can be stabilized more than in the case of FIG. 4. Also, the connection between the electrode 9 of the thin-type capacitor 7 and the metal film 28 formed on the rear surface 2 of the p-type semiconductor substrate 1 is made by a conductive DAF 8, whereby the same advantages as in FIG. 1 or FIG. 2 are obtained.

Figure 7:
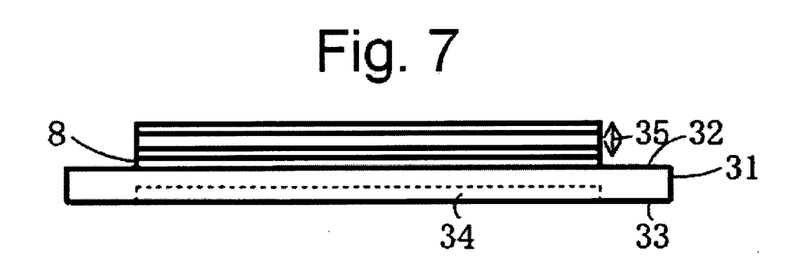
FIG. 7 is a sectional view of the essential portions of a stacked structure in which a thin-type capacitor for stabilizing a power source is stacked on ICs functioning as loads.

Additionally, a thin-type capacitor 35 which serves as a capacitor for stabilizing an IC power source may well be utilized in a state where, as shown in FIG. 7, it is secured by a conductive DAF 8, onto the rear surface 32 of a semiconductor substrate 31 formed with the ICs of loads 51-56. Also in this case, the rear surface 32 is brought to a GND potential. An element formation region 34 is formed on a surface 33 of the front side of the semiconductor substrate 31.

Incidentally, also in this embodiment, neither the wire bonding 26 nor the connection conductor 29 needs to be disposed in the case where the current which flows from the rear surface 2 to the GND terminal 13 is small.

Figure 8:
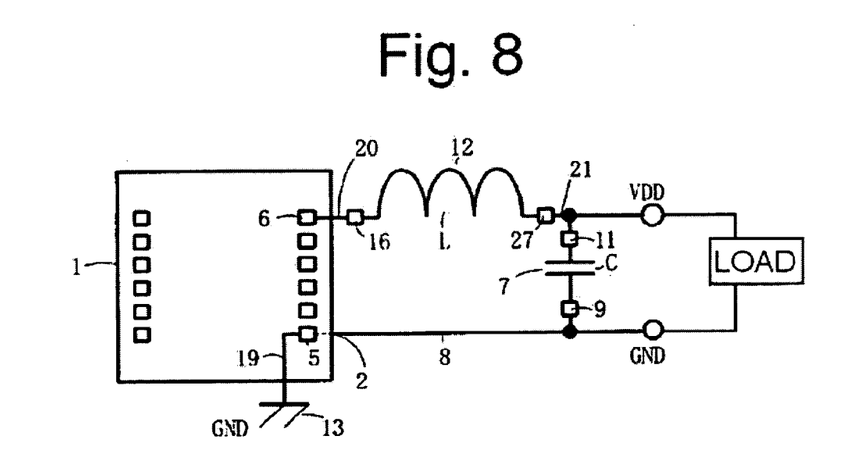
FIG. 8 is an arrangement diagram of the circuit of a DC-DC converter in which constituent parts of the composite semiconductor device according to FIG. 1 are indicated by numerals.

FIG. 8 is a view in which the constituent parts in FIG. 1 are indicated by numerals in the circuit arrangement of a DC-DC converter. The p-type semiconductor substrate 1 is formed with the power source IC, and letter L denotes the thin-type inductor 12, while letter C denotes the thin-type capacitor 7. Additionally, the electrode 5 and the GND terminal 13 are connected by the bump 19, the electrode 6 and the terminal 16 are connected by the bump 20, the terminal 27 and the electrode 11 are connected by the wire bonding 21, and the electrode 9 is connected with the rear surface 2 of the p-type semiconductor substrate 1 by the conductive DAF 8.

Further, the p-type semiconductor substrate 1 may be replaced sometimes with an n-type semiconductor substrate. Also in this case, the rear surface of the n-type semiconductor substrate is brought to the GND potential, and additionally, the front side surface thereof is brought to a minus potential. A p-type well region is formed in the surface layer of the front side of the n-type semiconductor substrate.

In addition, FIG. 8 or FIG. 9 illustrates the converter of a step-down type. However, the aspect of performance of this invention is not restricted thereto, but it may well be a DC-DC converter of a step-up type or a polarity inversion type or even a series regulator in which the inductor becomes unnecessary. Especially in the case of the DC-DC converter of a polarity inversion type, the terminals 13 and 16 of the inductor 12 shown in FIG. 5 can be made identical.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A composite semiconductor device, comprising:
   a thin-type capacitor having at least one electrode;
   a conductive die-attach film (DAF);
   a semiconductor substrate including:
      a rear surface to be brought to a ground potential (GND) and that is secured to one electrode of the at least one electrode of the thin-type capacitor through the conductive die-attach film, and
      a front side which is formed with elements and has an electrode provided on a surface thereof, and
   a thin-type inductor having at least one terminal,
   wherein one terminal of the at least one terminal of the thin-type inductor is secured by a bump to the electrode formed on the surface of the front side of the semiconductor substrate and another terminal of the at least one terminal of the thin-type inductor is connected to another electrode of the at least one electrode of the thin-type capacitor by wire bonding.

2. The composite semiconductor device as defined in claim 1, wherein the semiconductor substrate has a conductivity type that is a p-type.

3. The composite semiconductor device as defined in claim 1, further comprising a metal film formed on the rear surface of the semiconductor substrate, and the one electrode of the thin-type capacitor that is secured to the rear surface of the semiconductor substrate is secured through the metal film.

4. The composite semiconductor device as defined in claim 1,
   wherein a metal film is formed on the rear surface of the semiconductor substrate and is connected by wire bonding to a GND terminal formed in the thin-type inductor.

5. The composite semiconductor device as defined in claim 4, wherein the semiconductor substrate has a conductivity type that is a p-type.

6. The composite semiconductor device as defined in claim 4, wherein the one electrode of the thin-type capacitor that is secured to the rear surface of the semiconductor substrate is secured through the metal film.

7. The composite semiconductor device as defined in claim 1,
   wherein a metal film is formed on the rear surface of the semiconductor substrate and is connected to the electrode provided on the surface of the front side of the semiconductor substrate by a connection conductor which penetrates through the semiconductor substrate.

8. The composite semiconductor device as defined in claim 7, wherein the semiconductor substrate has a conductivity type that is a p-type.

9. The composite semiconductor device as defined in claim 7, wherein the one electrode of the thin-type capacitor that is secured to the rear surface of the semiconductor substrate is secured through the metal film.

10. The composite semiconductor device as defined in claim 1, wherein the semiconductor substrate has a conductivity type that is a p-type.

11. The composite semiconductor device as defined in claim 1, further comprising a metal film which is formed on the rear surface of the semiconductor substrate and which is connected to the electrode provided on the surface of the front side of the semiconductor substrate by a connection conductor which penetrates through the semiconductor substrate, wherein the one electrode of the thin-type capacitor that is secured to the rear surface of the semiconductor substrate is secured through the metal film.

12. A composite semiconductor device, comprising:
a thin-type capacitor having at least one electrode;
a conductive adhesive;
a semiconductor substrate that has including:
> a rear surface to be brought to a ground potential (GND) and that is secured to one electrode of the at least one electrode of the thin-type capacitor through the conductive adhesive, and
> a front side which is formed with elements and has an electrode provided on a surface thereof, and a thin-type inductor having at least one terminal,
wherein one terminal of the at least one terminal of the thin-type inductor is secured by a bump to the electrode formed on the surface of the front side of the semiconductor substrate and another terminal of the at least one terminal of the thin-type inductor is connected to another electrode of the at least one electrode of the thin-type capacitor by wire bonding.

13. The composite semiconductor device as defined in claim 12, wherein the conductive adhesive is a material selected from the group consisting of a silver paste and a solder.

14. The composite semiconductor device as defined in claim 13, further comprising a metal film formed on the rear surface of the semiconductor substrate, wherein the one electrode of the at least one electrode of the thin-type capacitor that is secured to the rear surface of the semiconductor substrate is secured through the metal film.

15. The composite semiconductor device as defined in claim 12, further comprising a metal film formed on the rear surface of the semiconductor substrate, wherein the one electrode of the at least one electrode of the thin-type capacitor that is secured to the rear surface of the semiconductor substrate is secured through the metal film.

* * * * *